(12) United States Patent
Tice et al.

(10) Patent No.: US 11,264,299 B1
(45) Date of Patent: Mar. 1, 2022

(54) DIRECT WRITE, HIGH CONDUCTIVITY MMIC ATTACH

(71) Applicant: NORTHROP GRUMMAN SYSTEMS CORPORATION, Falls Church, VA (US)

(72) Inventors: Jesse Tice, Torrance, CA (US); Steven J. Mass, La Palma, CA (US); Michael T. Barako, Redondo Beach, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/011,382

(22) Filed: Sep. 3, 2020

(51) Int. Cl.
*H01L 23/367* (2006.01)
*H01L 21/02* (2006.01)
*H01L 23/66* (2006.01)
*H01L 23/373* (2006.01)

(52) U.S. Cl.
CPC .... *H01L 23/3672* (2013.01); *H01L 21/02288* (2013.01); *H01L 23/3736* (2013.01); *H01L 23/66* (2013.01)

(58) Field of Classification Search
CPC . H01L 23/3672; H01L 23/3736; H01L 23/66; H01L 21/02288
See application file for complete search history.

(56) References Cited

U.S. PATENT DOCUMENTS

| | | | |
|---|---|---|---|
| 2004/0161908 A1* | 8/2004 | Terui | H01L 23/3677 438/460 |
| 2006/0033207 A1 | 2/2006 | Nakamura et al. | |
| 2013/0147050 A1* | 6/2013 | Bonner, III | H01L 23/367 257/773 |
| 2013/0320356 A1 | 12/2013 | Torabi et al. | |
| 2019/0189599 A1* | 6/2019 | Baloglu | H01L 23/5389 |
| 2020/0152557 A1 | 5/2020 | Lim | |
| 2020/0227332 A1* | 7/2020 | Singh | H01L 24/17 |
| 2021/0183722 A1* | 6/2021 | Anderson | H01L 23/3736 |

FOREIGN PATENT DOCUMENTS

| | | |
|---|---|---|
| EP | 2192614 A2 | 2/2010 |
| EP | 3354707 A1 | 8/2018 |
| EP | 3571716 A1 | 11/2019 |

* cited by examiner

*Primary Examiner* — Peniel M Gumedzoe
(74) *Attorney, Agent, or Firm* — John A. Miller; Shumaker, Loop & Kendrick, LLP

(57) ABSTRACT

An integrated circuit assembly including an integrated circuit formed on one side of a substrate and a thermal spreading layer composed of a silver ink directly printed on an opposite side of the substrate from the integrated circuit, where the thermal spreading layer removes heat generated by the integrated circuit. The assembly also includes a heat sink thermally attached to the thermal spreading layer opposite to the substrate, where the heat sink is attached to the thermal spreading layer by printing the same material on the heat sink as the thermal spreading layer and pressing the spreading layer to the heat sink.

16 Claims, 2 Drawing Sheets

DIRECT WRITE, HIGH CONDUCTIVITY MMIC ATTACH

BACKGROUND

Field

This disclosure relates generally to a thermal spreader for removing heat from an integrated circuit and, more particularly, to a monolithic microwave integrated circuit (MMIC) assembly including a thermal spreading layer consisting of silver ink that has been printed on a backside of a substrate.

Discussion of the Related Art

MMICs, sometimes referred to as chips or dies, are generally fabricated by epitaxially growing layers of certain semiconductor materials, such as GaN, InP, silicon, etc., on a certain crystalline substrate depending on the type of MMIC being made and for what application, such as power amplifiers, high-frequency switches, etc. As fabrication and growth technologies improve and more and more components are able to be formed into smaller areas, the power density of MMICs continues to significantly increase, which creates many design challenges for proper heat removal to prevent device degradation. Usually, an MMIC will be mounted to some type of a heat sink to draw heat away from the device and allow the power density of the device to increase without being degraded from over-heating.

In one known heat removal design for an MMIC, a thermal spreading layer, such as a copper-diamond (CuDi) or silver-diamond (AgDi) metal matrix having a thickness of about 0.01", is soldered using, for example, a gold-tin (AuSn) solder preform, to a backside of a substrate, for example, a silicon carbide (SiC) substrate, on which the MMIC is formed. The matrix is then glued to a heat sink, such as a block of copper, aluminum, tungsten, etc., using, for example, a namics silver epoxy, where the heat sink can be part of a hermetically sealed housing for the MMIC.

A thermal spreading layer for this purpose is designed to effectively spread out the heat across the spreading layer to quickly and efficiently transfer the heat from the MMIC to the heat sink. However, the thermal spreading layers of the type referred to above that employ a metal preformed matrix soldered to an MMIC substrate using a preformed solder are typically costly, difficult to align and configure, and difficult to be effectively thermally coupled to the substrate.

SUMMARY

The following discussion discloses and describes an integrated circuit assembly including an integrated circuit, such as an MMIC, formed on one side of a substrate and a thermal spreading layer composed of a silver ink directly printed on an opposite side of the substrate from the integrated circuit, where the thermal spreading layer removes heat generated by the integrated circuit. The assembly also includes a heat sink thermally coupled to the thermal spreading layer opposite to the substrate, where the heat sink is attached to the thermal spreading layer by printing the same material on the heat sink as the thermal spreading layer and pressing the spreading layer to the heat sink.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to an integrated circuit assembly including a thermal spreading layer consisting of silver ink that has been printed on a backside of a substrate is merely exemplary in nature, and is in no way intended to limit the disclosure or its applications or uses.

Figure 1:
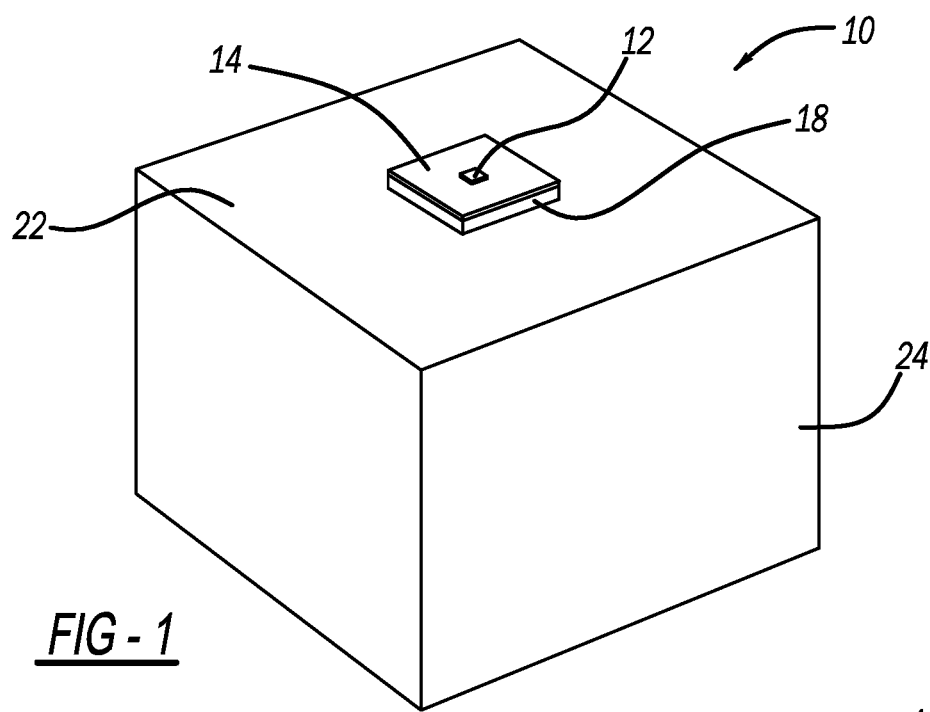
FIG. 1 is an isometric view of an integrated circuit assembly including an MMIC and a printed metal heat spreading layer.
Figure 2:
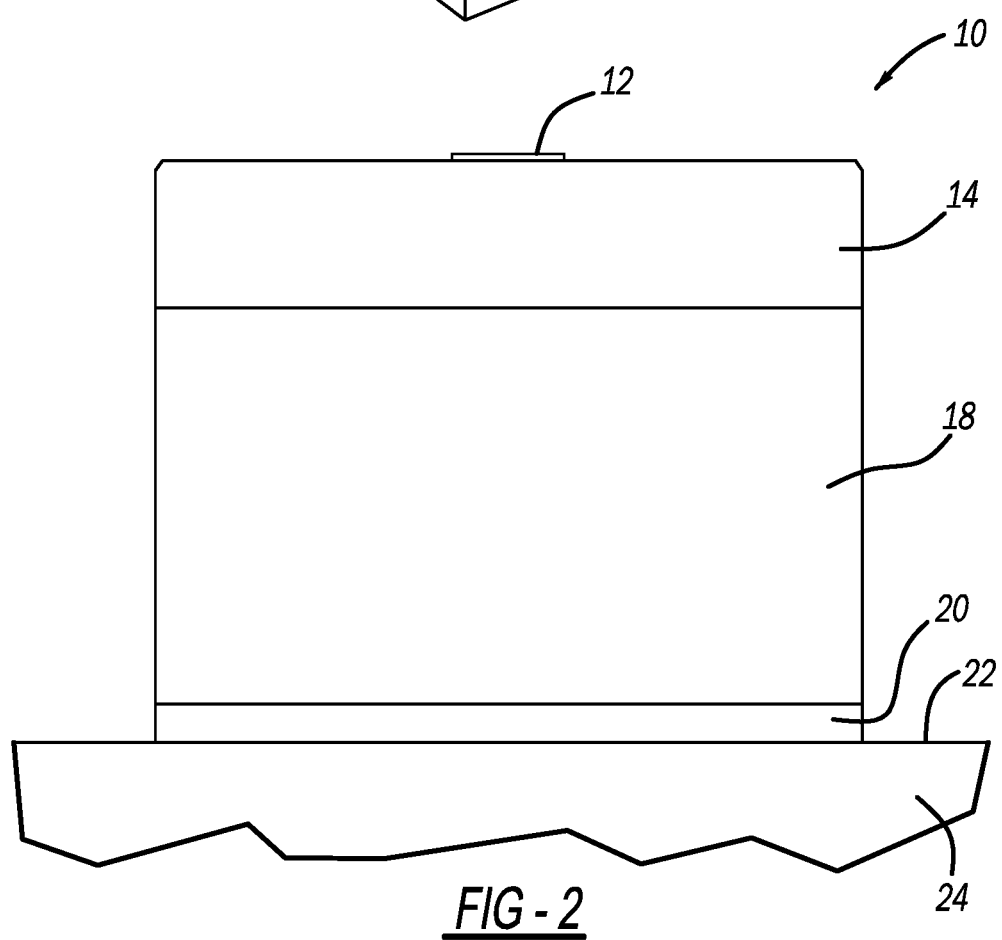
FIG. 2 is a profile view of the integrated circuit assembly shown in FIG. 1.

FIG. 1 is an isometric view and FIG. 2 is a profile view of an integrated circuit assembly 10 including an integrated circuit 12, for example, a GaN MMIC, fabricated or grown on a substrate 14, such as an SiC substrate, where the integrated circuit 12 can be fabricated to include components for any suitable device, such as a power amplifier. The integrated circuit assembly 10 includes a thermally conductive heat spreading layer 18 that has been printed onto a backside of the substrate 14 from the integrated circuit 12 using any suitable printing technique to any suitable thickness, such as 0.012", using any suitable thermally conductive ink material, such as a silver ink. The printing process typically lays down a thickness of about 0.0001" of the material for each printing cycle. A thin layer 20 of the thermally conductive ink material is also printed onto a top surface 22 of a heat sink 24, such as a metal block, for example, aluminum, copper, tungsten, etc. The heat sink 24 can be part of a thermally conductive and hermetically sealed housing for the integrated circuit 12 and other integrated circuits. While the layer 20 is still wet, the spreading layer 18 is pressed into contact with the layer 20 so that the spreading layer 18 with the substrate 14 is adhered to the heat sink 24 in a thermally coupled arrangement. By eliminating the solder preform that was used in the known designs to thermally couple the integrated circuit to the heat spreader, better thermal coupling can be achieved in combination with a less complex and less expensive process.

Figure 3:
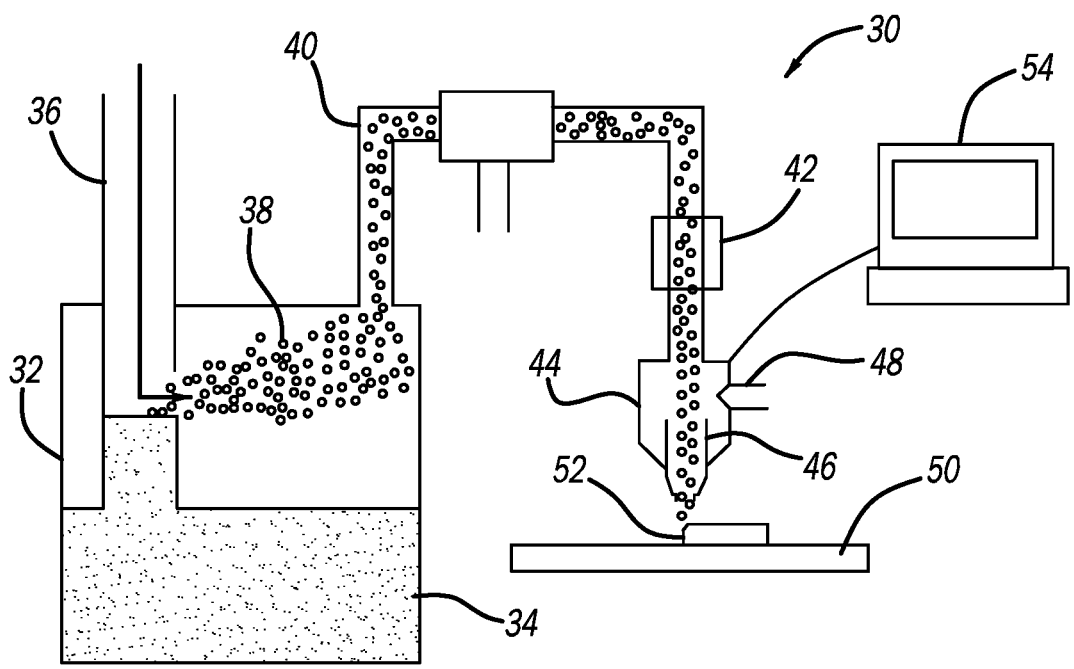
FIG. 3 is an illustration of an aerosol jet printer applicable to print the heat spreading layer for the integrated circuit assembly shown in FIG. 1.

The spreading layer 18 can be printed onto the substrate 14 using any suitable printing process, such as inject printing, aerosol jet printing, screen printing and selective plating. FIG. 3 is an illustration of an aerosol jet printing machine 30 that shows one suitable example. The machine 30 includes a container 32 of an ink material 34, here a composition of silver particles, that receives an atomizing gas, such as nitrogen, at an inlet 36 to generate an aerosol 38 that is sent through a tube 40, where the aerosol 38 is heated by a heater 42. The heated aerosol 38 is sent to a nozzle 44 that accepts a sheath gas 46 at an inlet 48 for containing the aerosol 38 when it is emitted from the nozzle 44 and directed onto a substrate 50 as a printed line 52, where the direction and amount of aerosol 38 that is sprayed out of the nozzle 44 is controlled by a computer 54.

Figure 4:
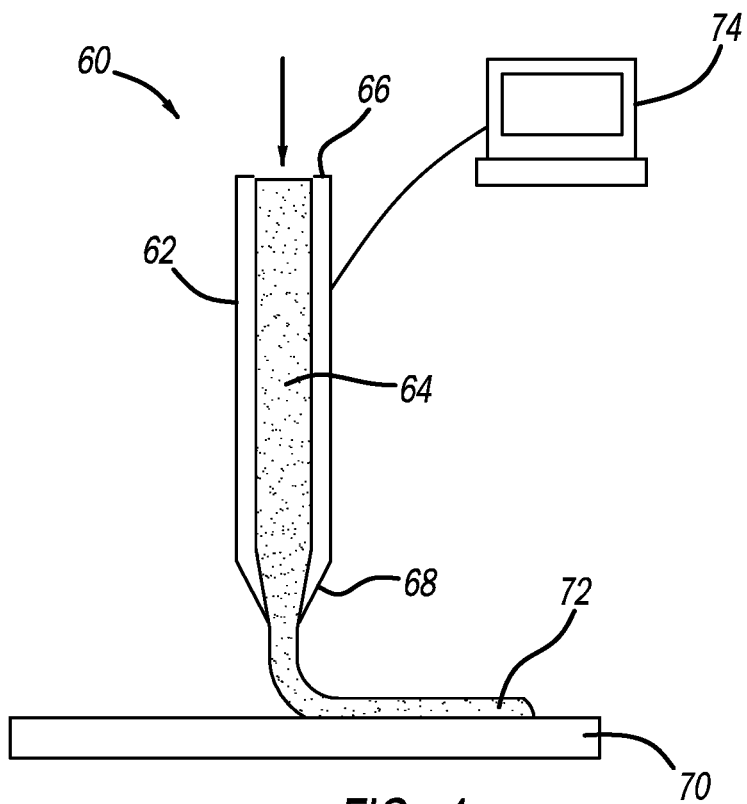
FIG. 4 is an illustration of an inkjet printer applicable to print the heat spreading layer for the integrated circuit assembly shown in FIG. 1.

FIG. 4 is an illustration of an inkjet printing machine 60 that shows another suitable example. The machine 60 includes a tube 62 enclosing an ink material 64, here a composition of silver, that receives a compressing gas, such as air, at an inlet 66 that forces the material 64 out of a nozzle 68 and onto a substrate 70 as a printed line 72, where the direction and amount of ink that is sprayed out of the nozzle 68 is controlled by a computer 74.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. An integrated circuit assembly comprising:
   a substrate;
   an integrated circuit formed on one side of the substrate;
   a thermal spreading layer printed on an opposite side of the substrate from the integrated circuit, wherein the thermal spreading layer removes heat generated by the integrated circuit; and
   a heat sink thermally attached to the thermal spreading layer opposite to the substrate, wherein the heat sink is part of a hermetically sealed housing for the integrated circuit.

2. The assembly according to claim 1 wherein the thermal spreading layer is printed directly on the substrate.

3. The assembly according to claim 1 wherein the thermal spreading layer is a silver composition.

4. The assembly according to claim 1 wherein the heat sink is attached to the thermal spreading layer by printing the same material on the heat sink as the thermal spreading layer and pressing the thermal spreading layer to the heat sink.

5. The assembly according to claim 1 wherein the substrate is a silicon carbide substrate.

6. The assembly according to claim 1 wherein the integrated circuit is a monolithic microwave integrated circuit (MMIC).

7. The assembly according to claim 1 wherein the thermal spreading layer is about 0.012" thick.

8. The assembly according to claim 1 wherein the thermal spreading layer is printed onto the substrate using an aerosol printer or an inkjet printer.

9. An integrated circuit assembly comprising:
   a substrate;
   a monolithic microwave integrated circuit (MMIC) formed on one side of the substrate;
   a thermal spreading layer composed of a silver ink directly printed on an opposite side of the substrate from the MMIC, wherein the thermal spreading layer removes heat generated by the MMIC; and
   a heat sink thermally attached to the thermal spreading layer opposite to the substrate, wherein the heat sink is attached to the thermal spreading layer by printing the same material on the heat sink as the thermal spreading layer and pressing the thermal spreading layer to the heat sink.

10. The assembly according to claim 9 wherein the heat sink is part of a hermetically sealed housing for the integrated circuit.

11. The assembly according to claim 9 wherein the thermal spreading layer is about 0.012" thick.

12. The assembly according to claim 9 wherein the thermal spreading layer is printed onto the substrate using an aerosol printer or an inkjet printer.

13. A method for providing an integrated circuit assembly, said method comprising:
    providing a substrate;
    forming an integrated circuit formed on one side of the substrate;
    printing a thermal spreading layer on an opposite side of the substrate from the integrated circuit, wherein the thermal spreading layer removes heat generated by the integrated circuit; and
    thermally attaching a heat sink to the thermal spreading layer opposite to the substrate, wherein attaching the heat sink to the thermal spreading layer includes printing the same material on the heat sink as the thermal spreading layer and pressing the spreading layer to the heat sink.

14. The method according to claim 13 wherein printing the thermal spreading layer includes directly printing the spreading layer on the substrate.

15. The method according to claim 13 wherein the thermal spreading layer is a silver composition.

16. The method according to claim 13 wherein printing the thermal spreading layer onto the substrate includes using an aerosol printer or an inkjet printer.

* * * * *